(12) United States Patent
Retuta et al.

(10) Patent No.: US 9,281,218 B2
(45) Date of Patent: Mar. 8, 2016

(54) METHOD OF PRODUCING A SEMICONDUCTOR PACKAGE

(75) Inventors: Danny Retuta, Singapore (SG); Hien Boon Tan, Singapore (SG); Anthony Yi Sheng Sun, Singapore (SG); Mary Annie Cheong, Singapore (SG)

(73) Assignee: UNITED TEST AND ASSEMBLY CENTER LTD., Singapore (SG)

( * ) Notice: Subject to any disclaimer, the term of this patent is extended or adjusted under 35 U.S.C. 154(b) by 1193 days.

(21) Appl. No.: 11/846,658

(22) Filed: Aug. 29, 2007

(65) Prior Publication Data

US 2008/0061414 A1 Mar. 13, 2008

Related U.S. Application Data

(60) Provisional application No. 60/840,951, filed on Aug. 30, 2006, provisional application No. 60/840,954, filed on Aug. 30, 2006.

(51) Int. Cl.
*H01L 21/00* (2006.01)
*H01L 21/48* (2006.01)
*H01L 23/495* (2006.01)
*H01L 23/00* (2006.01)

(52) U.S. Cl.
CPC ...... *H01L 21/4832* (2013.01); *H01L 23/49582* (2013.01); *H01L 24/48* (2013.01); *H01L 24/45* (2013.01); *H01L 24/49* (2013.01); *H01L 2224/32245* (2013.01); *H01L 2224/45139* (2013.01); *H01L 2224/45144* (2013.01); *H01L 2224/48091* (2013.01); *H01L 2224/48247* (2013.01); *H01L 2224/48465* (2013.01); *H01L 2224/48599* (2013.01); *H01L 2224/48639* (2013.01); *H01L 2224/49171* (2013.01); *H01L 2224/49433* (2013.01); *H01L 2224/73265* (2013.01); *H01L 2224/85439* (2013.01); *H01L 2924/014* (2013.01); *H01L 2924/01005* (2013.01); *H01L 2924/01006* (2013.01); *H01L 2924/01027* (2013.01); *H01L 2924/01028* (2013.01); *H01L 2924/01029* (2013.01); *H01L 2924/01033* (2013.01); *H01L 2924/01047* (2013.01); *H01L 2924/01076* (2013.01); *H01L 2924/01078* (2013.01); *H01L 2924/01079* (2013.01); *H01L 2924/01082* (2013.01); *H01L 2924/181* (2013.01); *Y10T 29/49121* (2015.01)

(58) Field of Classification Search
CPC .................. H01L 21/4832; H01L 23/49582; H01L 24/48
USPC .......................................... 438/611, 123, 124
See application file for complete search history.

(56) References Cited

U.S. PATENT DOCUMENTS 6,025,650 A * 2/2000 Tsuji et al. .................... 257/786
6,498,099 B1 12/2002 McLellan et al.
(Continued)

FOREIGN PATENT DOCUMENTS

WO 2005/000568 1/2005

*Primary Examiner* — Mark Tornow
(74) *Attorney, Agent, or Firm* — Sughrue Mion, PLLC

(57) ABSTRACT

A method of manufacturing a lead frame includes providing an electrically conductive layer having a plurality of holes at a top surface. The plurality of holes form a structure of leads and a die pad on the electrically conductive layer. The plurality of holes are filled with a non-conductive material. Next; an electrically conductive foil is attached on the top surface of the electrically conductive layer and the non-conductive epoxy material. Then, the electrically conductive foil is etched to create a network of leads, die pad, bus lines, dam bars and tie lines, wherein the bus lines connect the leads to the dam bar, the dam bar is connected to the tie line and the tie line is connected to the die pad.

19 Claims, 16 Drawing Sheets

(56) References Cited

U.S. PATENT DOCUMENTS

| | | | |
|---|---|---|---|
| 6,548,328 B1 * | 4/2003 | Sakamoto et al. | 438/121 |
| 6,635,957 B2 | 10/2003 | Kwan et al. | |
| 6,882,057 B2 | 4/2005 | Hsu | |
| 6,933,594 B2 | 8/2005 | McLellan et al. | |
| 6,967,125 B2 | 11/2005 | Fee et al. | |
| 6,987,030 B2 * | 1/2006 | Mita | 438/106 |
| 7,009,286 B1 | 3/2006 | Kirloskar et al. | |
| 2006/0186517 A1 * | 8/2006 | Jang | 257/676 |

* cited by examiner

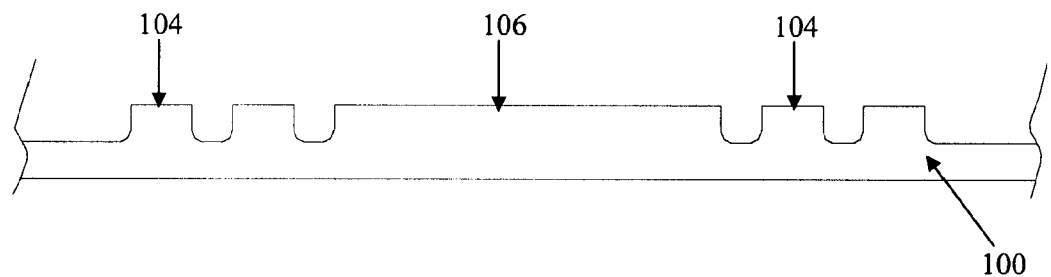
FIG. 3D(i)
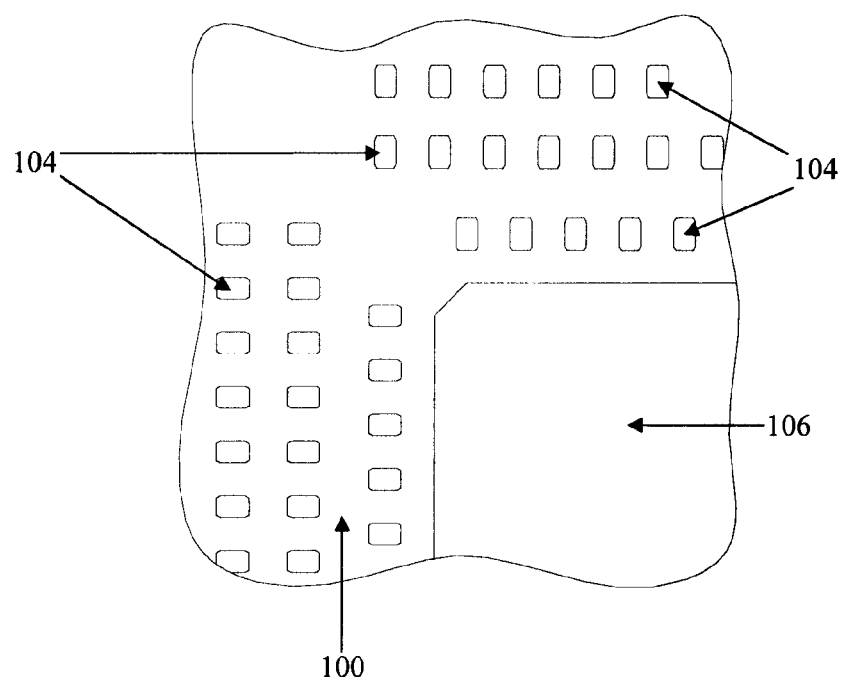
FIG. 3D(ii)

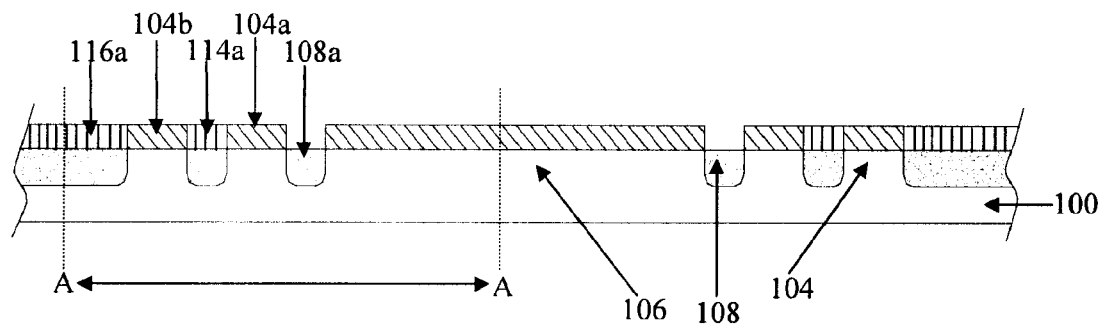
FIG. 3G(i)
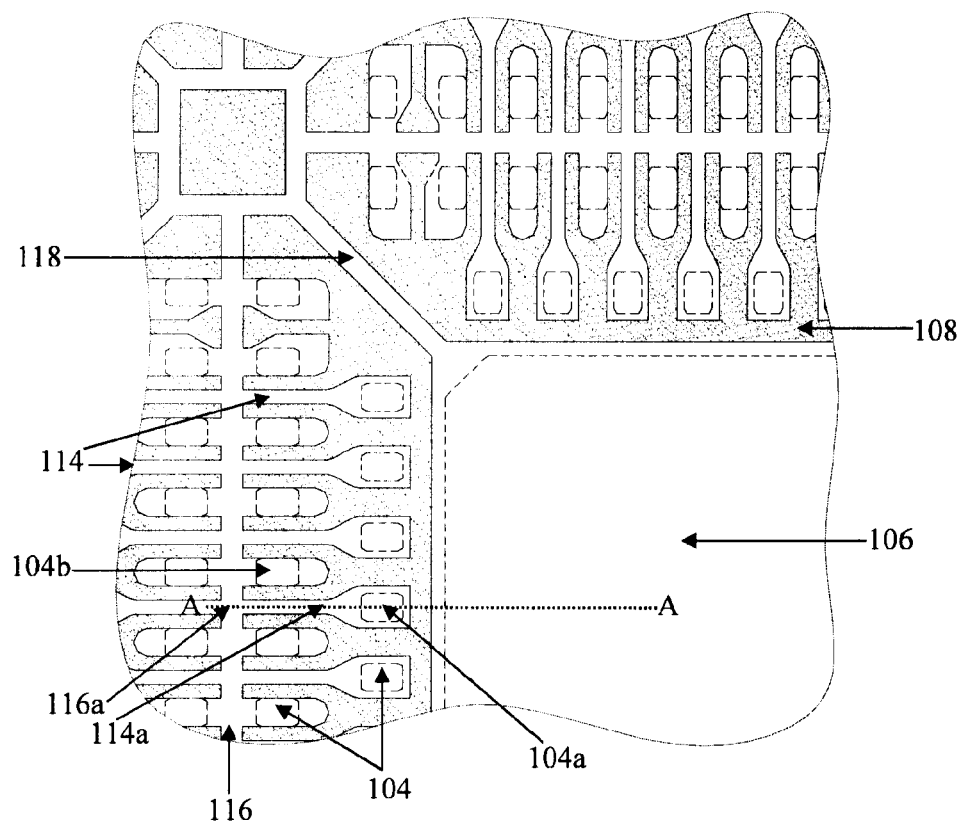
FIG. 3G(ii)

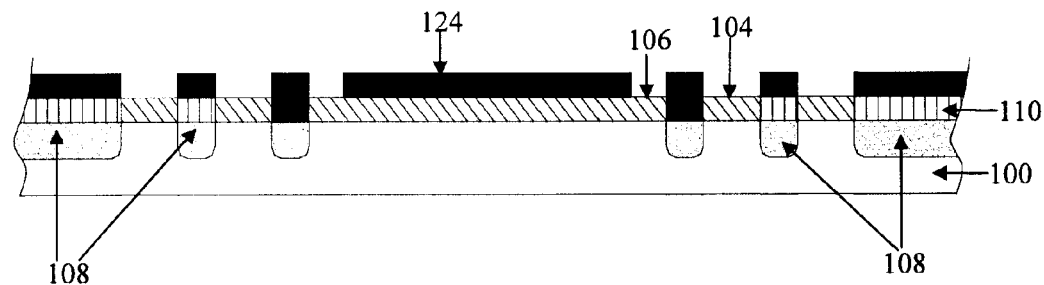
FIG. 3H(i)
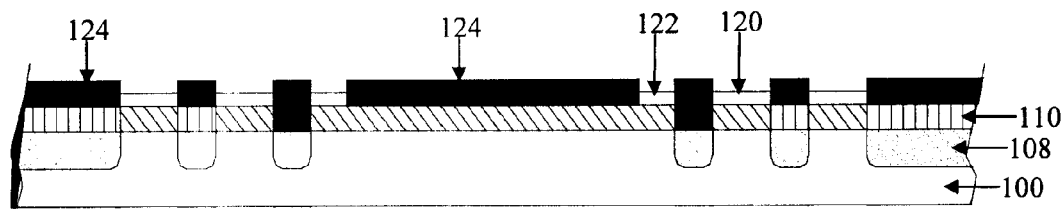
FIG. 3H(ii)
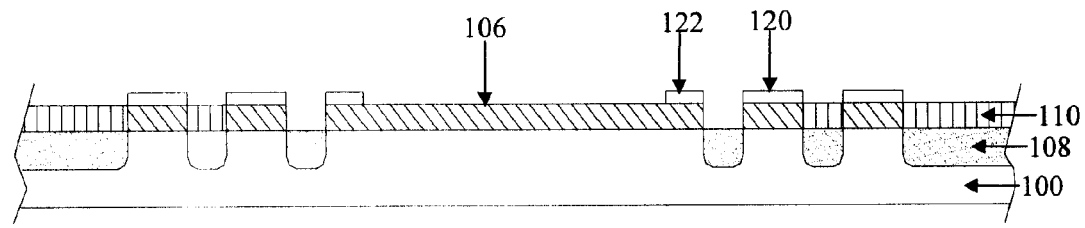
FIG. 3H(iii)

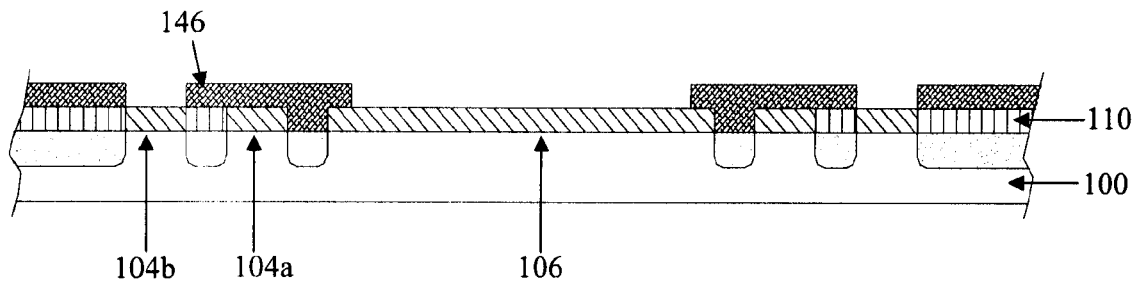
FIG. 6A(i)
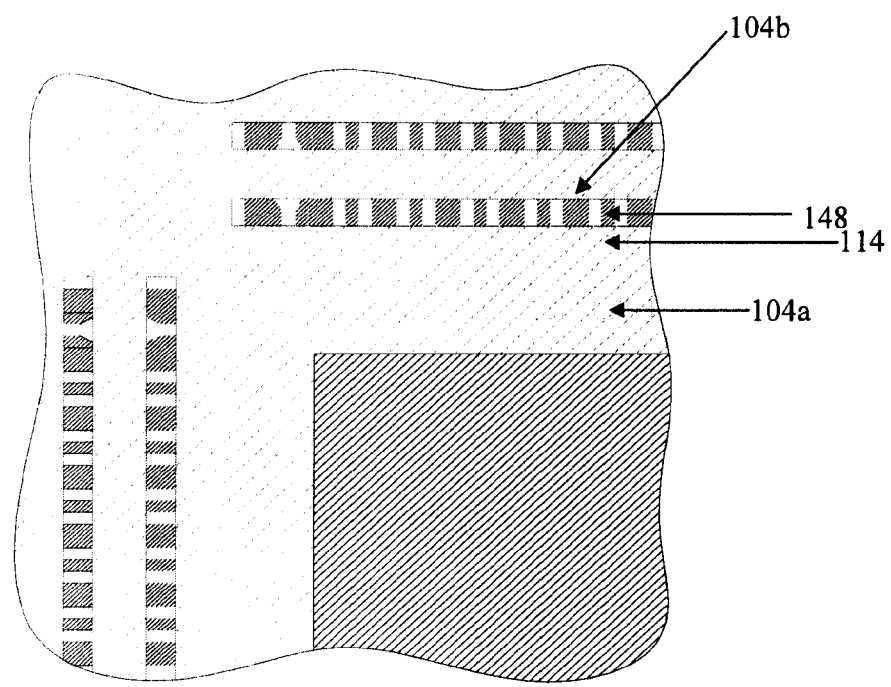
FIG. 6A(ii)

METHOD OF PRODUCING A SEMICONDUCTOR PACKAGE

BACKGROUND OF THE INVENTION

This application claims benefit of U.S. Provisional Application Nos. 60/840,951 and 60/840,954, both filed on Aug. 30, 2006, which are incorporated herein by reference.

FIELD OF THE INVENTION

The present invention relates to methods of manufacturing a semiconductor package and in particular, a multi-row quad flat non-leaded (QFN) package.

DESCRIPTION OF THE RELATED ART

A quad flat non-leaded (QFN) package is a semiconductor package that is generally used in surface mounted electronic circuit designs. The QFN package does not have external leads extending out of the package, and instead has integrated leads arranged along periphery of the die pad area at the bottom surface of the package body. Advantageously, such a form of leads can shorten the transmittance distance and hence reduce resistance to improve signal transmission. Multi-row QFN packages have two or more rows of leads surrounding the periphery of the die pad area.

One currently available multi-row QFN package is a thin array plastic (TAP) package. An example TAP package 10 is described in FIG. 1. FIG. 1 describes a QFN package 10 having a die pad 12 and a plurality of rows of leads 14 surrounding the die pad 12. A semiconductor die 16 is attached to the upper surface of the die pad 12 using an epoxy adhesive 18. The semiconductor die 16 is connected to the leads 14 via bond wires 20 extending from the die 16 to the upper surface of the leads 14. The die 16, the leads 14 and the bond wires 20 are encapsulated in a mold compound 24. The bottom surface of each of the leads has terminals 22 for use in further connections, for example, for connecting to a printed circuit board (PCB).

However, there are several limitations to the TAP package. For example, as the number of input/outputs (I/Os) or rows of leads increases, space for the additional rows of leads would have to be taken from the die pad area thereby requiring the size of the die to be decreased in order to accommodate the additional rows of leads. While the size of the package can be increased to maintain the die size and to accommodate the additional rows of leads, increasing the package size can be undesirable as it may increase manufacturing costs and may affect the circuit design.

FIG. 2 shows the top view of the TAP package 10. It will be noted that the bond wires 20 connecting the die 16 to the leads 14 are longer and overlap more as a result of the additional rows of leads 14.

In addition, as the leads 14 in the assembled package 10 are isolated from one another, electrolytic solder plating of the exposed leads 14 for further processing of the package is not possible.

There is therefore a need to provide a method of manufacturing a semiconductor package that can overcome or at least ameliorate one or more of the above limitations.

SUMMARY OF THE INVENTION

An embodiment of the method of manufacturing a lead frame includes the following steps:

(a) providing an electrically conductive layer having a plurality of holes at a top surface, wherein the plurality of holes form a structure of leads and a die pad on said electrically conductive layer;

(b) filling the plurality of holes with a non-conductive material;

(c) attaching an electrically conductive foil on the top surface of the electrically conductive layer and the non-conductive epoxy material; and (d) etching the electrically conductive foil to create a network of leads, die pad, bus lines, dam bars and tie lines, wherein the bus lines connect the leads to the dam bar, the dam bar is connected to the tie line and the tie line is connected to the die pad.

Another embodiment of the method of manufacturing a lead frame includes the following steps after step (d) above:

attaching a solder mask to selected areas of the electrically conductive foil and the non-conductive epoxy material, wherein the solder mask covers at least one inner row of leads, and the solder mask has a plurality of openings that expose at least one outer row of leads and expose portions of the bus lines, that are connected to said inner row of leads, away from the inner row of leads.

An embodiment of a method of manufacturing a semiconductor package according to the invention includes:

(a) providing an electrically conductive layer having a plurality of holes at a top surface;

(b) filling the plurality of holes with a non-conductive material;

(c) attaching an electrically conductive foil on the top surface of the electrically conductive layer and the non-conductive material;

(d) etching the electrically conductive foil to create a network of leads, die pad, bus lines, dam bars and tie lines, wherein the bus lines connect the leads to the dam bar, the dam bar is connected to the tie line and the tie line is connected to the die pad;

(e) attaching a semiconductor die to the die pad;

(f) etching a bottom surface of the electrically conductive layer to isolate the leads from each other.

Another embodiment of a method of manufacturing a semiconductor package according to the invention includes after step (d) above:

attaching a solder mask to selected areas of the electrically conductive foil and the non-conductive material, wherein the solder mask covers one at least one inner row of leads, and the solder mask has a plurality of openings that expose at least one outer row of leads and expose portions of the bus lines, that are connected to the inner row of leads, away from the inner row of leads.

An embodiment of a semiconductor package according to the invention includes:

an electrically conductive layer having a plurality of holes at a top surface, wherein the plurality of holes are filled with a non-conductive material;

an electrically conductive foil on the top surface of the electrically conductive layer and the non-conductive material, wherein the electrically conductive foil creates a network of leads, die pad, bus lines, dam bars and tie lines, wherein the bus lines connect the leads to the dam bar, the dam bar is connected to the tie line and the tie line is connected to the die pad; and a semiconductor die attached to the die pad.

Another embodiment of a semiconductor package according to the invention includes:

an electrically conductive layer having a plurality of holes at a top surface, wherein the plurality of holes are filled with a non-conductive material;

an electrically conductive foil on the top surface of the electrically conductive layer and the non-conductive material, wherein the electrically conductive foil creates a network of leads, die pad, bus lines, dam bars and tie lines, wherein the bus lines connect the leads to the dam bar, the dam bar is connected to the tie line and the tie line is connected to said die pad; and a solder mask attached to selected areas of the electrically conductive foil and the non-conductive material, wherein the solder mask covers at least one inner row of leads, and the solder mask has a plurality of openings that expose at least one outer row of leads and expose portions of the bus lines, that are connected to the inner row of leads, away from the inner row of leads;

a conductor material on selected areas of the top surface of the electrically conductive layer; and a semiconductor die attached to portions of the conductor material and the solder mask.

BRIEF DESCRIPTION OF THE DRAWINGS

Many aspects of the invention can be better understood with reference to the following drawings. The components in the drawings are not necessarily to scale, emphasis instead being placed upon clearly illustrating the principles of the present invention. Moreover, in the drawings, like reference numerals designate corresponding parts throughout the several views.

FIGS. 3A-3M illustrate a method, according to an embodiment of the present invention, for producing a multi-row QFN package.

FIGS. 6A-6F illustrate a method, according to a third alternate embodiment of the present invention, for producing a multi-row QFN package.

Figure 1:
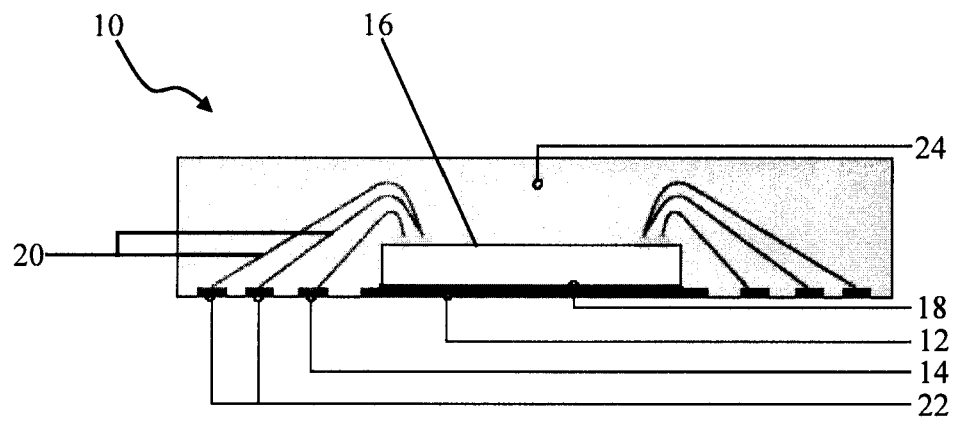
FIG. 1 shows a cross-sectional view of a thin array plastic (TAP) package.
Figure 2:
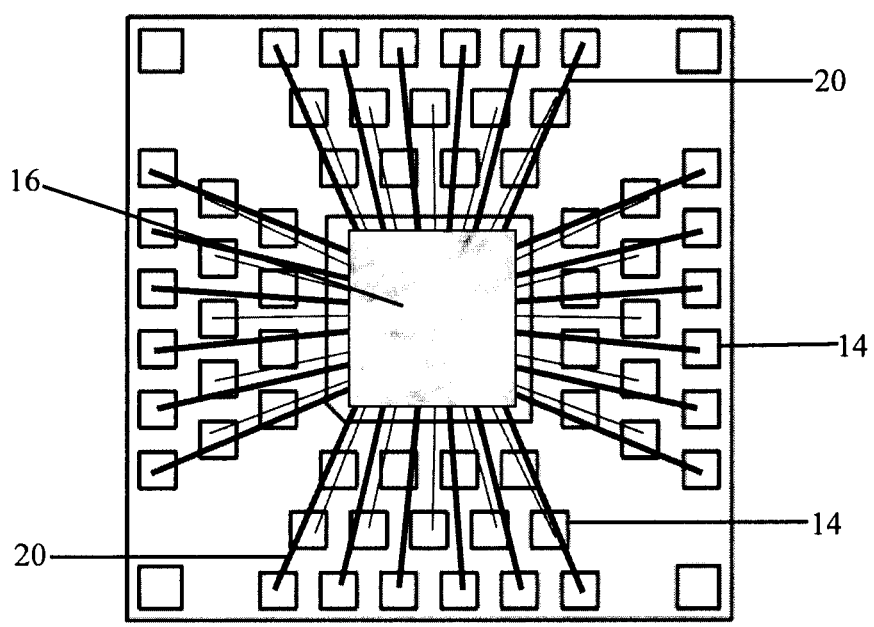
FIG. 2 shows a top view of the TAP package of FIG. 1.

DETAILED DESCRIPTION OF THE ILLUSTRATIVE NON-LIMITING EMBODIMENTS OF THE INVENTION

Hereinafter, the present invention will be described in detail by way of exemplary embodiments with reference to the drawings. The described exemplary embodiments are intended to assist in the understanding of the invention, and are not intended to limit the scope of the invention in any way.

Throughout the drawings for explaining the exemplary embodiments, those components having identical functions carry the same reference numerals for which duplicate explanations will be omitted.

Figure 3A:
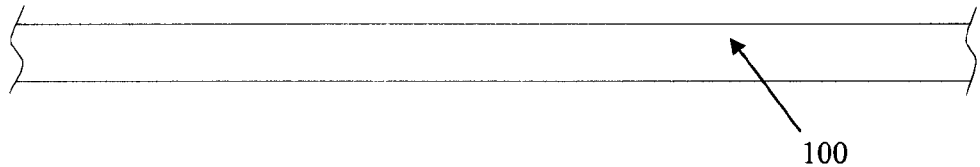
Figure 3B:
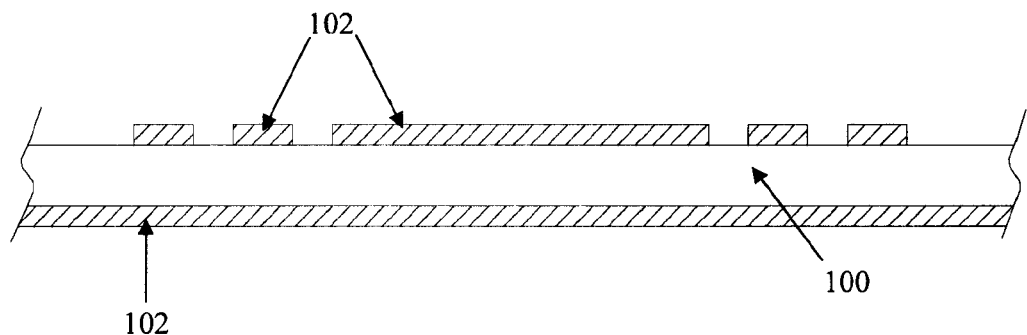

A non-limiting embodiment of a method for fabricating a semiconductor package is described below with reference to FIGS. 3A to 3M. As shown in FIGS. 3A and 3B, a resist 102 is laminated on both the top and bottom sides of a base copper layer 100. The resist 102 is developed to create a mask where terminals/leads 104 and a die pad 106 as shown in FIG. 3C can be formed in a subsequent etching process.

Figure 3C:
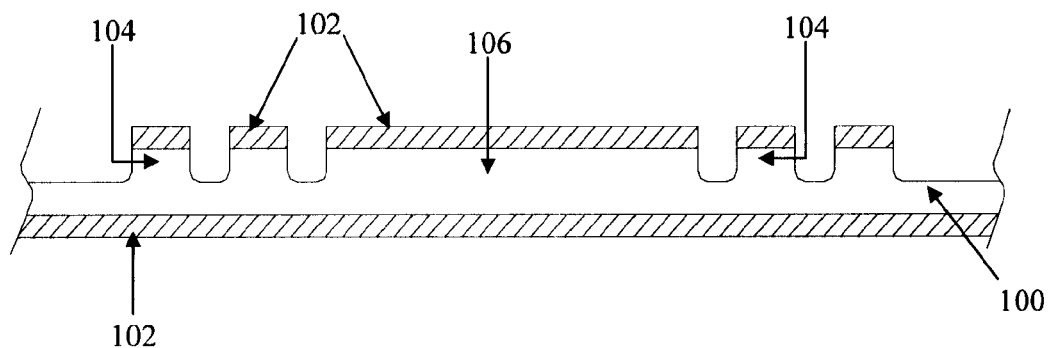

In FIG. 3C, the base copper layer 100 is half-etched to form terminals/leads 104 and die pad 106. It will be appreciated that the base copper layer 100 can be partially etched to any desired extent and need not be limited to being half-etched as described in this embodiment. The resist 102 is then stripped off to reveal a half-etched base copper layer 100 having a structure of formed terminal/leads 104 and a die pad 106, in which a cross-sectional view of a portion of the structure is shown in FIG. 3D(i). FIG. 3D(ii) shows a top view of a portion of the half-etched base copper layer 100.

Figure 3E:
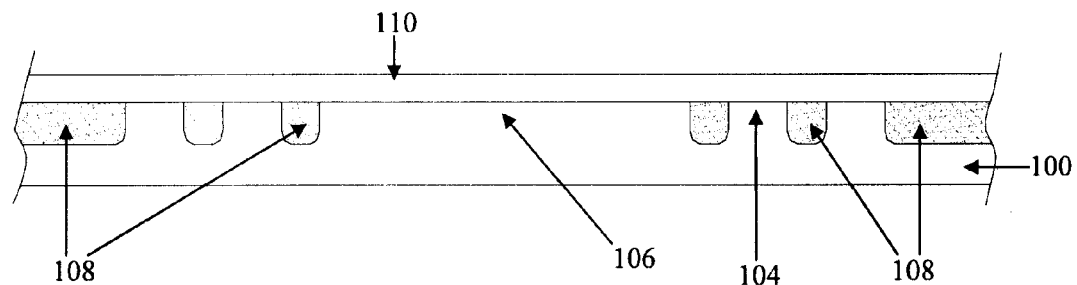

Referring to FIG. 3E, the areas that were half-etched are filled with a non-conductive material such as epoxy 108. A copper foil 110 is then deposited on top of the base copper layer 100 and the non-conductive epoxy 108. The copper foil 110 may be deposited using lamination, hot-press or other conventional methods known to the person skilled in the art.

Figure 3F:
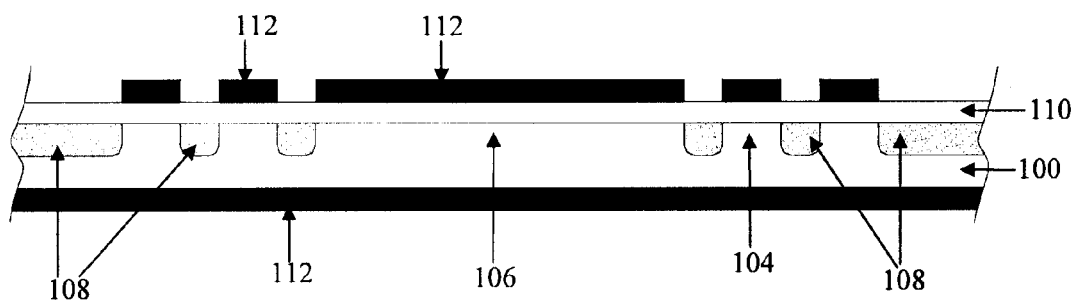

Referring to FIG. 3F, a resist 112 is laminated on both the top of the copper foil 110 and the bottom of the base copper layer 100. The resist is developed to create a mask where a network of terminals/leads 104, bus lines 114, tie bars 118 and dam bars or plating bar 116 as shown in FIGS. 3G(i) and 3G(ii) can be formed in a subsequent etching process.

Referring to FIGS. 3G(i) and 3G(ii), the exposed portions of the copper foil 110 are etched and the resist 112 is subsequently stripped off. FIG. 3G(i) shows a cross-sectional view of a portion of an etched structure comprised of the copper base layer 100, the non-conductive epoxy 108 and the copper foil 110. The non-etched portions of the copper foil 110 formed the network of terminal/leads 104, the bus lines 114, the dam bars 116 and the tie bars 118 as shown in FIG. 3G(i). A top view of the etched structure is shown in FIG. 3G(ii), in which section A-A corresponds to section A-A of FIG. 3G(i). It can, for example, be seen from FIGS. 3G(i) and 3G(ii) that the bus line 114a connects inner lead 104a to dam bar 116a. The dam bar 116a is connected to outer lead 104b and extends toward the tie bar 118. The tie bar 118 is connected to the die pad 106. Such a network of bus lines 114, dam bars 116 and tie bars 118 advantageously maintains electrical communication between the leads 104 and die pad 106 such that the electrolytic processes, such as electrolytic solder plating, can be subsequently carried out on the assembled structure during further stages of processing.

As shown in FIGS. 3H(i)-(iii), the etched structure from FIGS. 3G(i) and 3G(ii) are further processed to plate a conductive material such as silver on the leads 104 to form bond fingers 120 and to plate a conductive material such as silver on the periphery of the die pad 106 to form ground bond area 122. Referring to FIG. 3H(i), a resist 124 is first laminated on the etched structure comprised of the copper base layer 100, the non-conductive epoxy 108 and the copper foil 110. The resist 124 is developed to create a mask where the silver plating can be applied at the leads 104 to form bond fingers 120 and the periphery of the die pad 106 to form ground bond areas 122. Referring to FIG. 3H(ii), silver is plated onto the exposed areas of the etched structure to thereby form the bond fingers 120 and the ground bond areas 122 when the resist 124 is removed. The resulting lead frame is shown in FIG. 3H(iii).

Figure 3I:
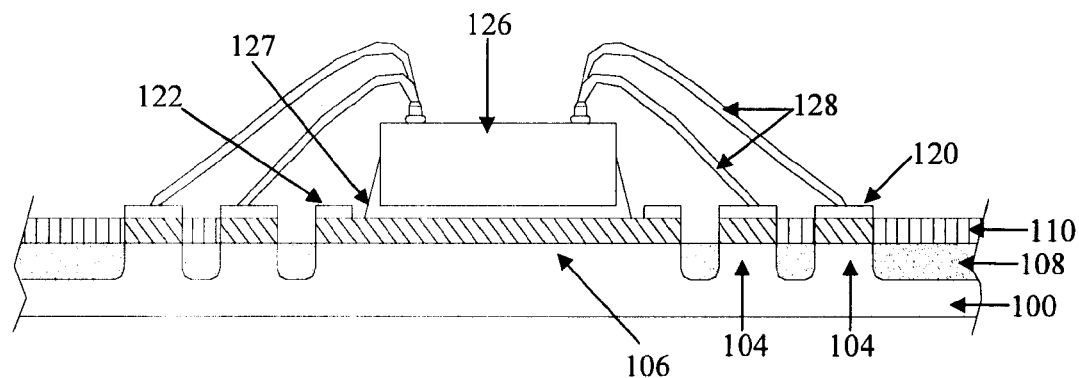
Figure 3J:
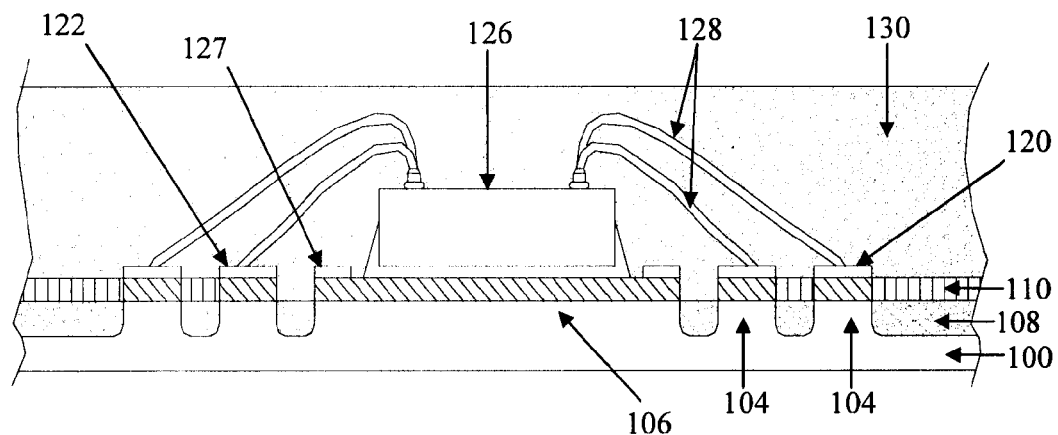

Referring to FIG. 3I, a semiconductor die 126 is attached to the die pad 106 using a die attach epoxy 127. Bond wires 128 extend from the die 126 to the terminals/leads 104, and the respective ends of the wires 128 are attached to the ground bond areas 122 of the die 126 and the bond fingers 120 using wire bonding. The bond wires 128 can, for example, be gold or silver bond wires. Referring to FIG. 3J, the structure comprised of the semiconductor die 126, the bond wires 128, and the silver plated leads 104 or bond fingers 120 (i.e., the wire-bonded areas) are encapsulated with a mold compound 130.

Figure 3K:
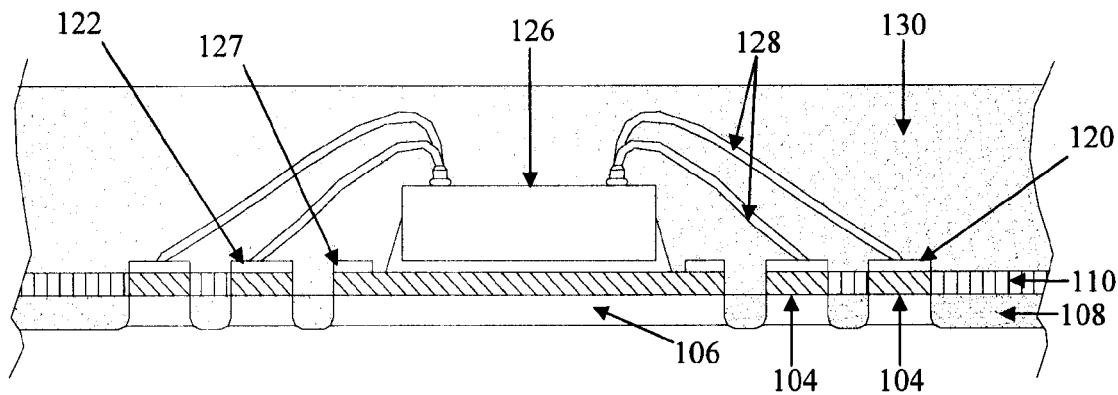

Referring to FIG. 3K, the bottom of the base copper layer 100 is back-etched until the bottom portion of the leads 104 are completely isolated from one another. The exposed bottom portion of the leads 104 and die pad 106 are then plated with a solder material 132 as shown in FIG. 3L using an electrolytic solder plating process.

Figure 3L:
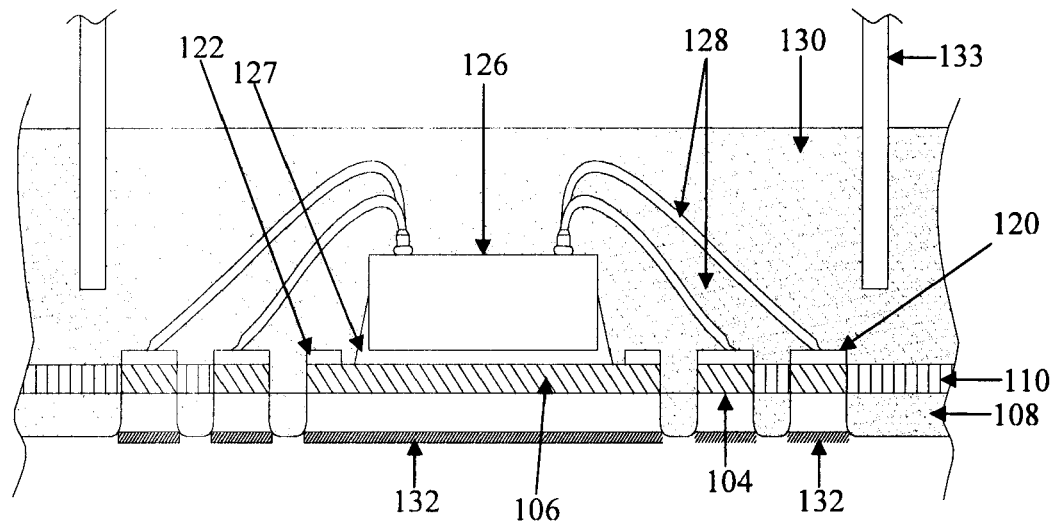
Figure 3M:
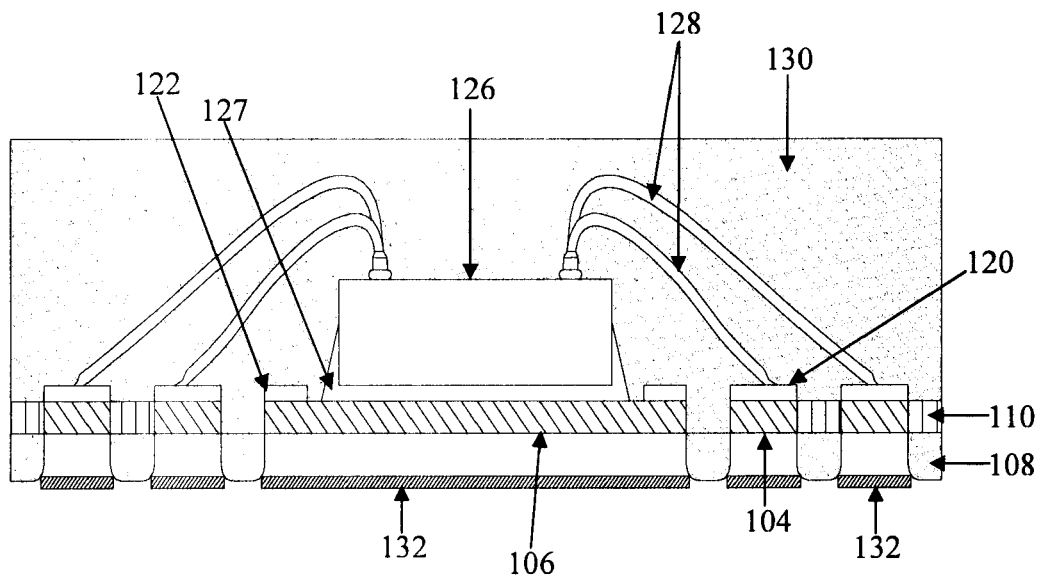

A singulation blade 133 as shown in FIG. 3L is used to singulate the assembled structure into each individual unit. FIG. 3M shows the final semiconductor product after it has been singulated.

Figure 4:
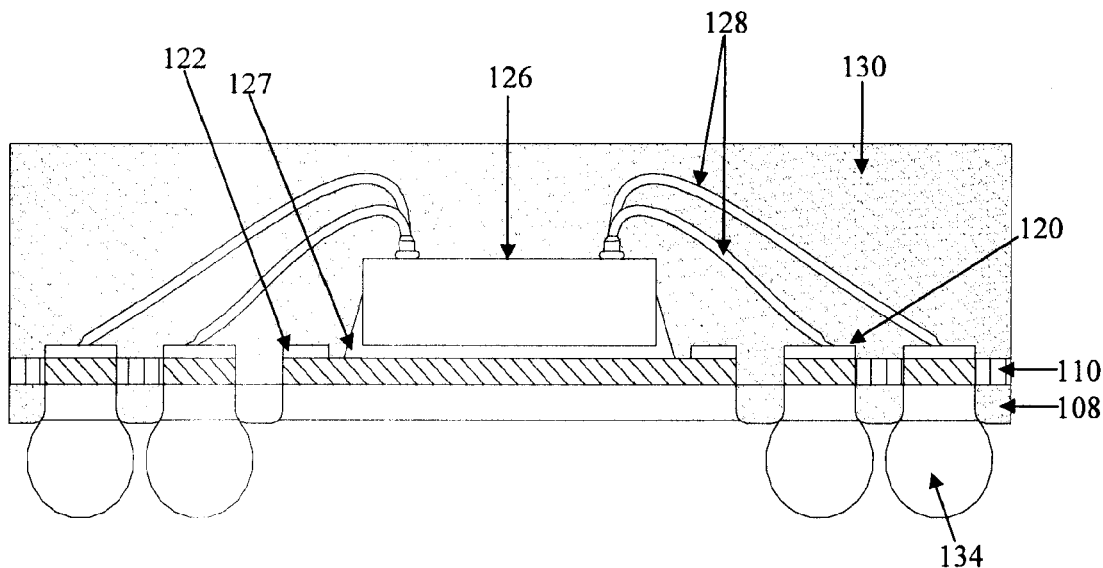
FIG. 4 shows a QFN package in accordance with a first alternate embodiment of the present invention.

A first alternate embodiment of the present invention includes all of the steps as described above for and as shown in FIGS. 3A through 3K. However, instead of solder plating the exposed leads 104 and die pad 106 as shown in FIG. 3L, solder balls 134 are attached to the exposed leads 104 as shown in FIG. 4.

Figure 5A:
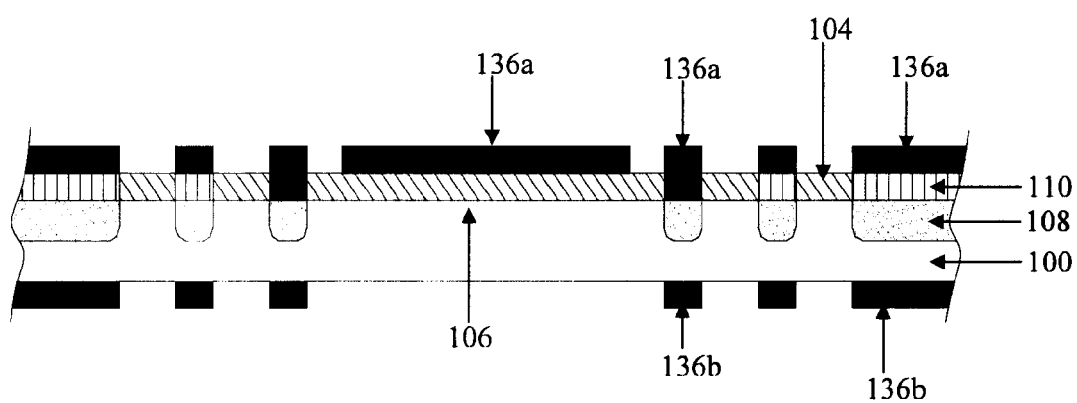
FIGS. 5A-5I illustrate a method, according to a second alternate embodiment of the present invention, for producing a multi-row QFN package.

A second alternate embodiment of the present invention includes all of the steps described above for and as shown in FIGS. 3A through 3G. However, instead of continuing with the steps as described with reference to FIGS. 3H-3M, the following method as described with reference to FIGS. 5A to 5I is used. Referring to FIG. 5A, a first resist 136a is laminated on the copper foil 110 and a second resist 136b is laminated at the bottom of copper base layer 100. The first resist 136a is developed to expose only the terminals/leads 104 and the periphery portion of the die pad 106. The second or bottom resist 136b is also developed to create a pattern of exposed areas which is a mirror image of the terminals/leads 104.

Figure 5B:
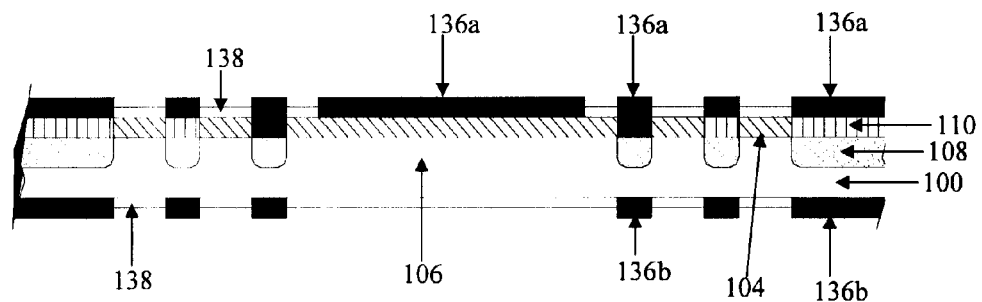
Figure 5C:
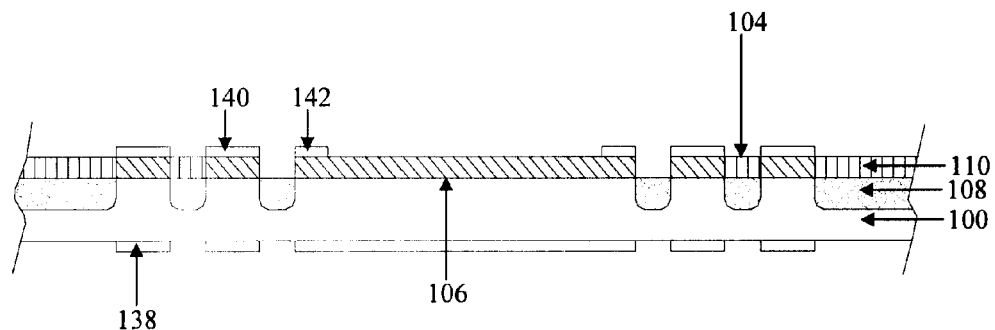

Next, as shown in FIG. 5B, the exposed portions are plated with one or more conductive materials 138 such as nickel and gold, followed by removal of the first and second resists 136a, 136b to form the lead frame as shown in FIG. 5C. The gold and nickel may be deposited as separate layers in a volume ratio of about 1:10 to 1:15 or about 1:12. The gold layer can be a bottom layer and the nickel layer can be a top layer. For example, the gold layer can have a thickness of about 0.4 micrometer and the nickel layer can have a thickness of about 5 micrometer. The nickel/gold plated leads 104 form bond fingers 140 and the nickel/gold plated periphery portions of the die pad 106 form ground bond areas 142.

Figure 5D:
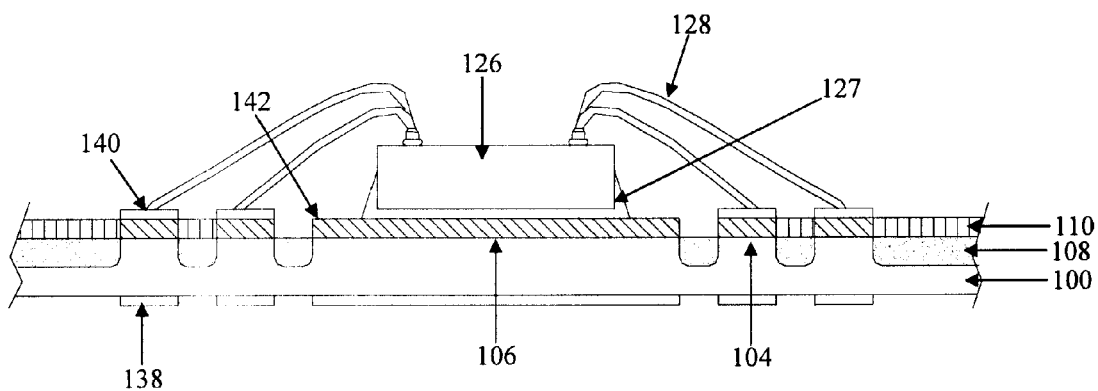
Figure 5E:
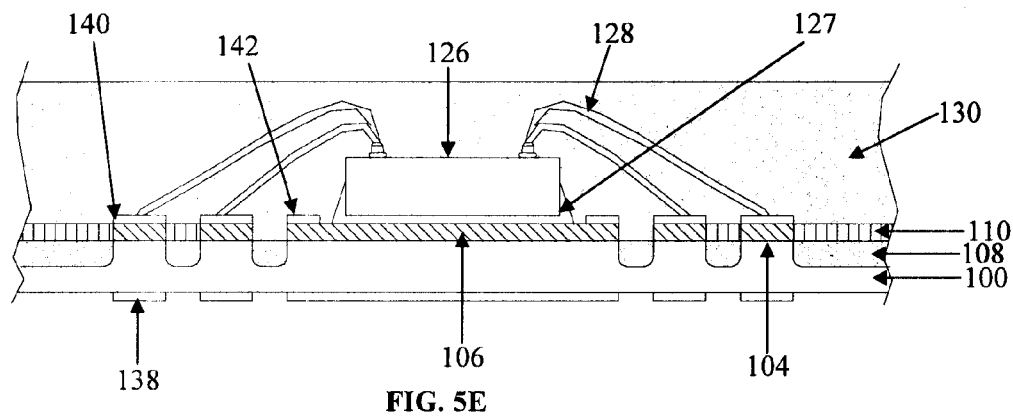

Referring to FIG. 5D, a semiconductor die 126 is attached to the die pad 106 using a die attach epoxy 127 as adhesive. Bond wires 128 extend from the die 126 to the terminals/leads 104, and the respective ends of the wires 128 are attached to the ground bond areas 142 of the die 126 and the bond fingers 140 using wire bonding. In one embodiment, gold or silver bond wires are used. Referring to FIG. 5E, the structure comprised of the semiconductor die 126, the bond wires 128, and the nickel/silver plated leads or 104 or bond finger 140 are encapsulated with the mold compound 130.

Figure 5F:
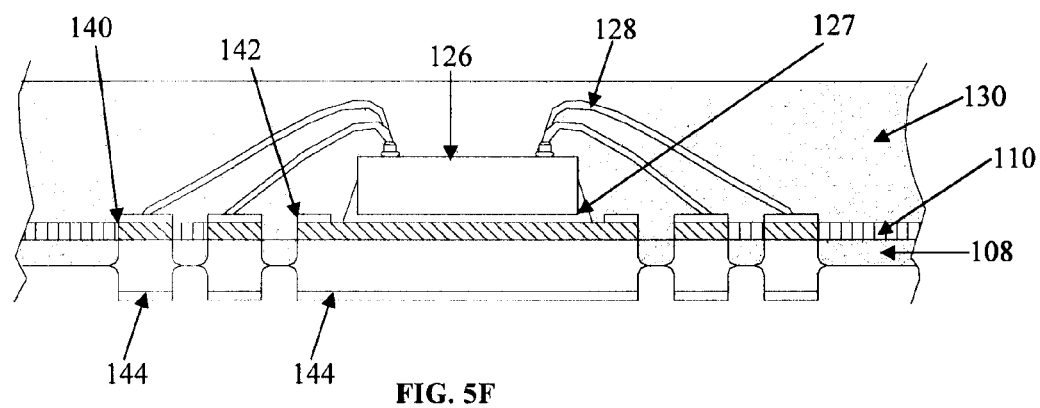

As shown in FIG. 5F, the bottom of the base copper 100 is back-etched until the bottom portion of the leads 104 are completely isolated from one another. The bumps 144 formed from the bottom portion of the leads 104 and from the die pad 106 are developed after the etching due to the presence of the nickel/gold plating 138, which acts as a stopper for the etching solution.

Figure 5G:
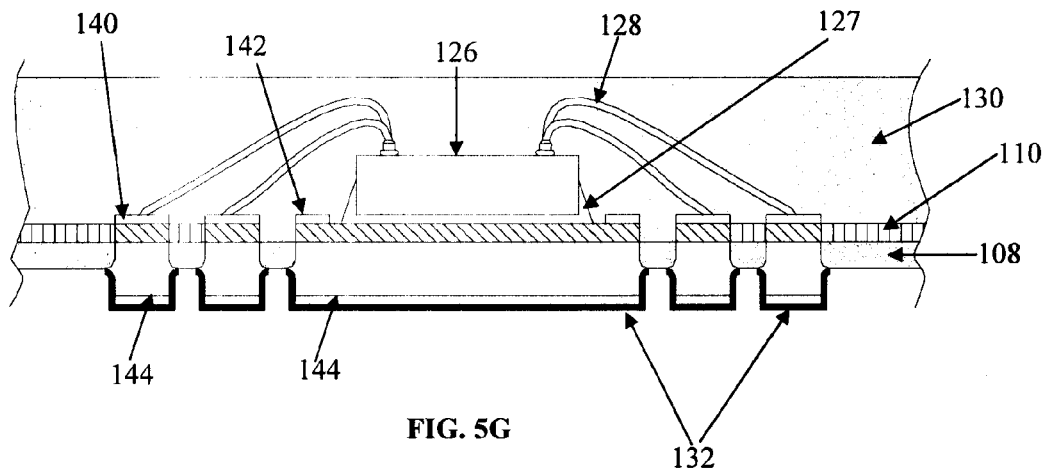

Referring to FIG. 5G, the bumps 144 or bottom areas of the leads 104 and the die pad 106, are plated with solder material 132 by an electrolytic process. The solder plating process is possible due to the presence of bus lines 114, tie bars 118 and dam bars 116 formed from the copper foil 110 during the second etching process as described in FIGS. 3E to 3G. It will be appreciated by that all exposed copper at the bottom side can be plated during the electrolytic process because the terminals/leads 104 are still connected to the main frame by means of the network of bus lines 114, tie bars 118 and dam bars 116.

Figure 5H:
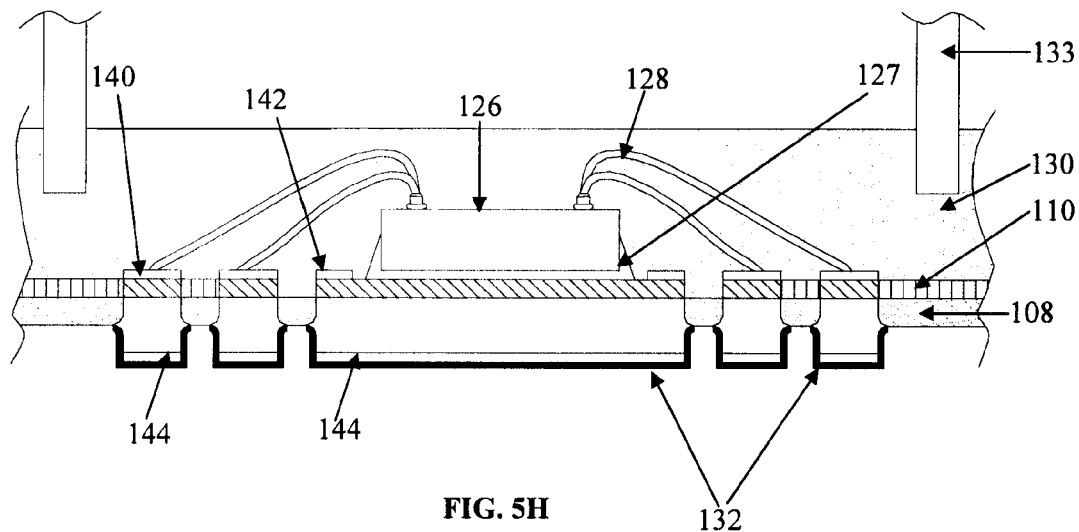

Referring to FIG. 5H, a singulation blade 133 is used to singulate each individual unit.

Figure 5I:
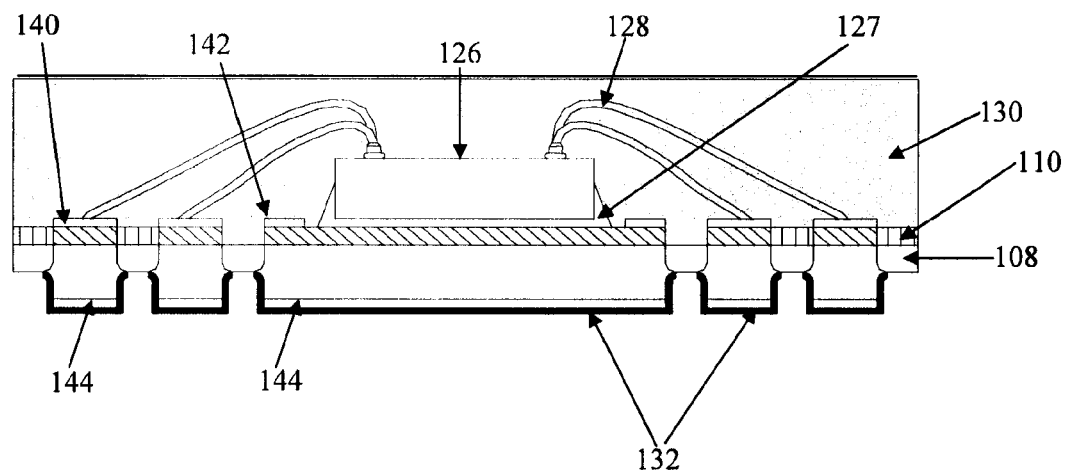

FIG. 5I shows the final singulated semiconductor product.

Figure 6B:
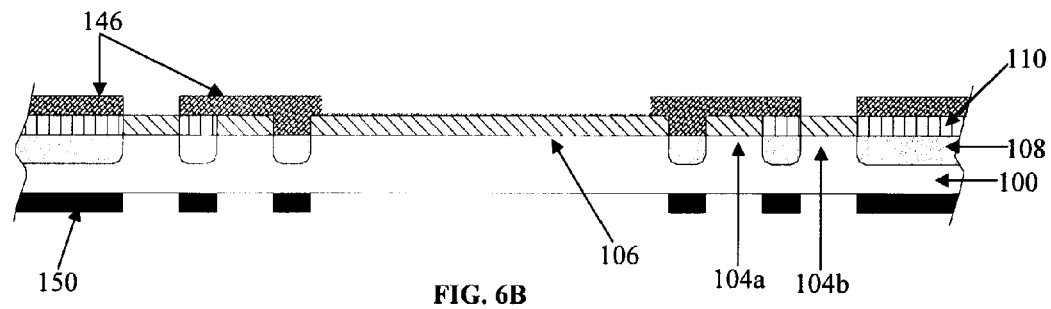

A third alternate embodiment of the present invention includes all of the steps as described above for and as shown in FIGS. 3A through 3G. However, instead of continuing with the steps as described with reference to FIGS. 3H to 3M, the following method is used as described with reference to FIGS. 6A to 6F. First, as shown in FIGS. 6A(i) and 6A(ii), a solder mask 146 is laminated on the top surface, exposing areas that are already in line with the outer leads 104b. The solder mask extends over the inner leads 104a thereby creating additional surface area for attachment of the die 126. To enable the inner leads 104a to be wire bonded to the die, bond fingers 148 for the inner leads 104s are created along the outer portion of the bus line 114 adjoining the respective inner leads 104a covered by the solder mask. Accordingly, in addition to exposing the areas above the outer leads 104b, the solder mask 146 also exposes the outer portions of the bus lines 114 that are in electrical communication with the inner leads 104a to form bond fingers 148. Such a structure advantageously allows bonding of the die 126 to the inner leads 104a even when the die 126 is sitting on top of them, and thereby overcomes the problem of having to reduce die sizes should the number of rows of leads increases.

Referring to FIG. 6B, a resist 150 is laminated on the bottom of copper base layer 100. The resist 150 is developed to create openings that mirror the terminal/leads and die pad layout on the top surface.

Figure 6C:
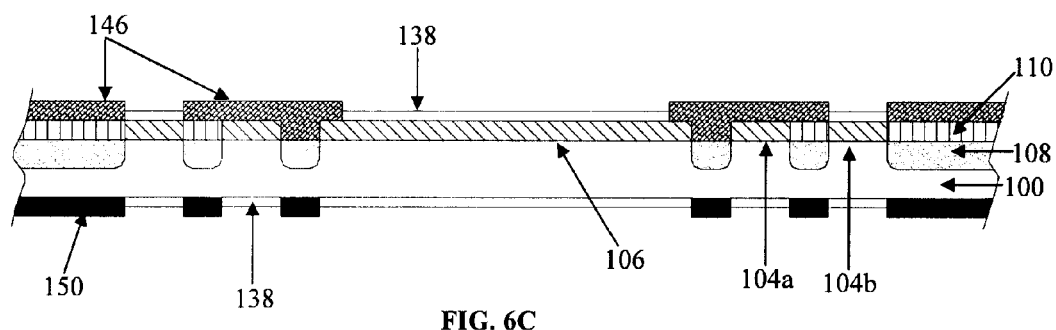
Figure 6D:
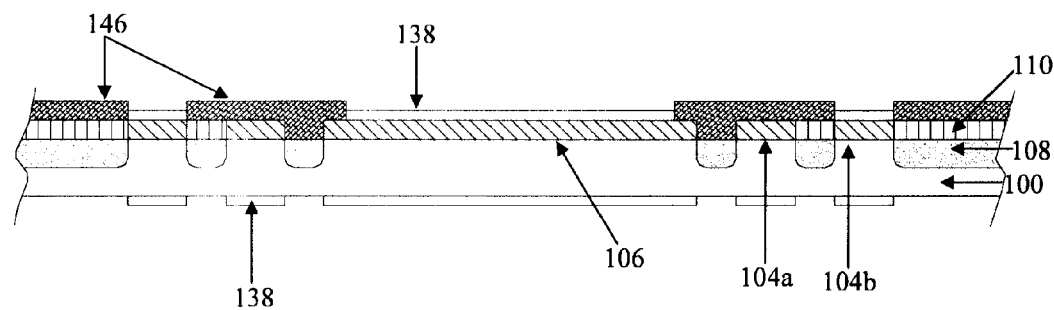

Referring to FIG. 6C, the exposed portions of the top and bottom surfaces are plated with one or more conductive materials 138 such as nickel and gold and the resist 150 is stripped off to form the lead frame as shown in FIG. 6D. The gold and nickel may be deposited as separate layers in a volume ratio of about 1:10 to 1:15 or about 1:12. The gold layer can be a bottom layer and the nickel layer can be a top layer. For example, the gold layer can have a thickness of about 0.4 micrometer and the nickel layer can have a thickness of about 5 micrometer.

Figure 6E:
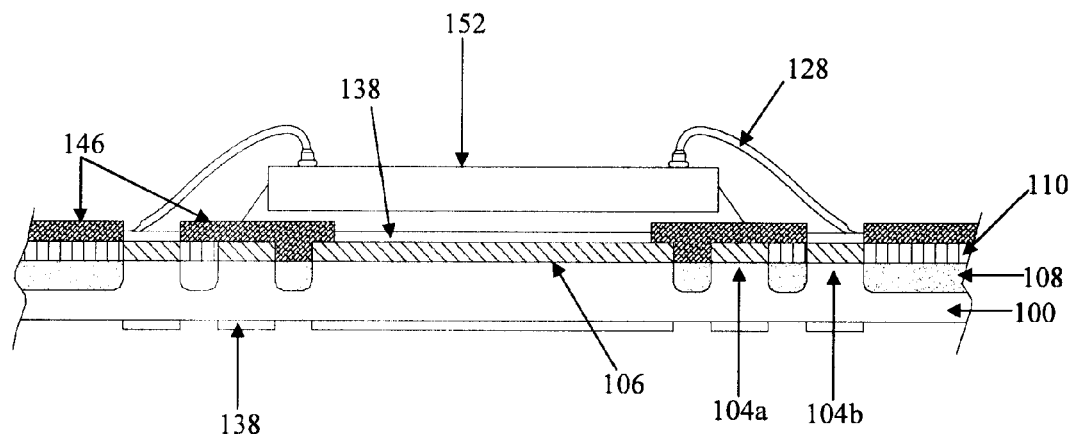
Figure 6F:
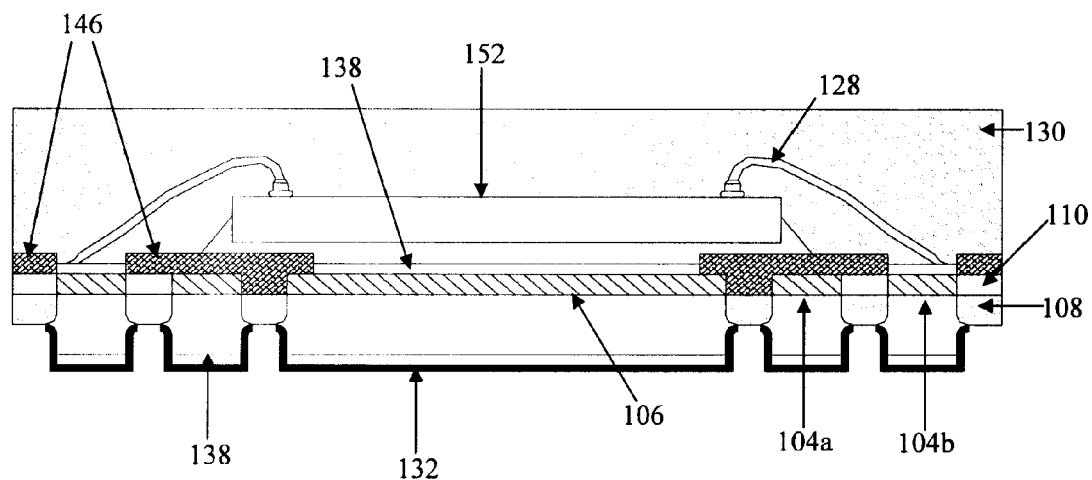

Referring to FIG. 6E, a die 152 that is larger than the size of the die pad 106 area is attached to the die pad 106 using die attach epoxy 127. Bond wires 128 extend from the die 152 to the nickel/gold plated outer leads 104b and the bond fingers 148 associated with the inner leads 104a. In one embodiment, silver or gold wire bonds are used. Referring to FIG. 6F, the structure comprised of the die 152, the bond wires 128, the nickel/gold plated outer leads 104b and the bond fingers 148 are encapsulated with mold compound 130.

As shown in FIG. 6F, the bottom of the base copper layer 100 is back-etched until the leads 104 are completely isolated from one another. Bumps 144 formed from the bottom portion of the leads 104 and the die pad 106 after the etching, are developed due to the presence of the nickel/gold plating 138a, 138b, which acts as a stopper for the etching solution.

Next, the bumps 144 formed from the leads 104 and the die pad 106 are plated with solder material 132 by an electrolytic process. The solder plating process is possible due to the presence of bus lines 114, tie bars 118 and dam bars 116. All exposed copper can be plated during the electrolytic process because the terminals/leads are still connected to the main frame.

Next, a singulation blade 133 (not shown) is used to singulated each individual unit to result in the final semiconductor product as shown in FIG. 6F.

It will be appreciated that the formation of the solder mask 146 as shown in FIGS. 6A(i) and 6A(ii) can be incorporated into the described embodiment and alternate embodiments. The solder mask 149 can be applied to the structure as shown in FIG. 3G before proceeding with the described subsequent steps for the above embodiment and alternate embodiments to overcome the problem of having to reduce die size when the number of rows of leads 104 increases.

Figure 7A:
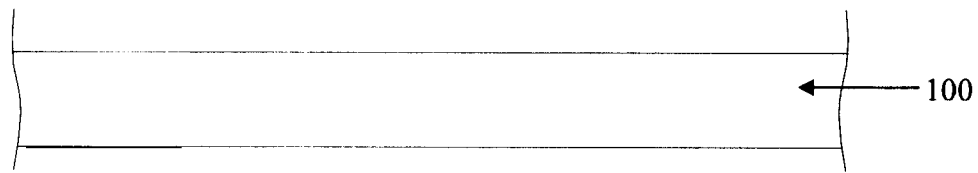
FIGS. 7A-7D illustrate a method, according to a fourth alternate embodiment of the present invention, for producing a multi-row QFN package.
Figure 7B:
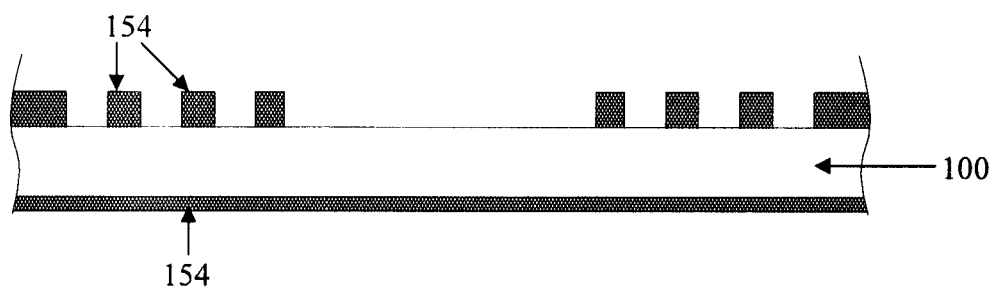
Figure 7C:
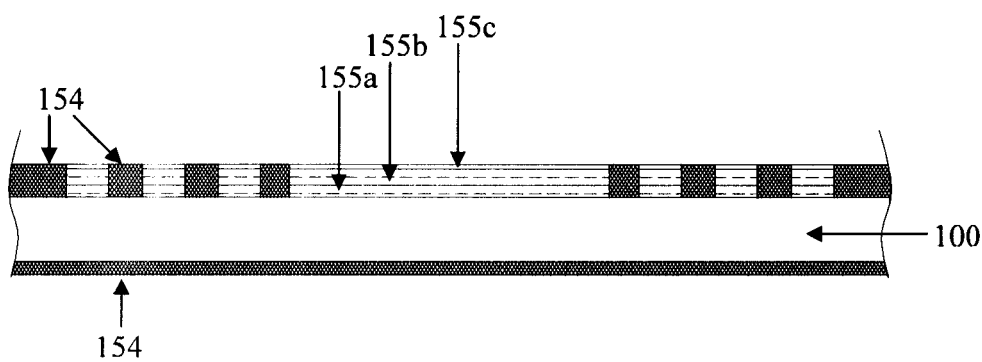
Figure 7D:
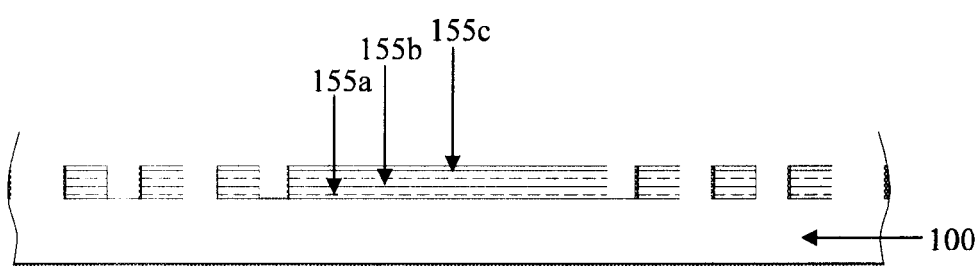

A fourth alternate embodiment of the present invention includes all of the steps as described in the embodiment and in the alternate embodiments above except that instead of forming a half-etched copper base structure having leads 104 and die pad 106 portions as shown in FIG. 3D, a similar structure is formed from the following method as described with reference to FIGS. 7A to 7D. Referring to FIGS. 7A and 7B, a resist 154 is laminated on the top and bottom sides of the base copper layer 100. The top resist 154 is developed to create a mask that exposes the areas for formation of leads 156 and die pad 158 as shown in FIGS. 7C and 7D in a subsequent plating process. As shown in FIG. 7C, the exposed portions of FIG. 7B are plated with one or more conductive materials such as gold, nickel and copper 155a, 155b, 155c to thereby form the leads 156 and die pad 158 as shown in FIG. 7D upon removal of the resist 154. The gold, nickel and copper may be deposited as separate layers. The gold and nickel layers may be deposited in a volume ratio of about 1:10 to 1:15 or about 1:12, and the remaining being copper. The gold layer can be a bottom layer, the nickel layer can be an intermediate layer and the copper layer can be a top layer. It will be appreciated that subsequent steps as described above with reference to FIGS. 3E to 3M, FIG. 4, FIGS. 5A to 5I and FIGS. 6A to 6F can be carried out on the structure as shown in FIG. 7D.

It should be emphasized that the above-described embodiments of the present invention are merely possible examples of implementations, merely set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

What is claimed is:

1. A method of manufacturing a lead frame comprising:
   (a) providing an electrically conductive layer having a plurality of holes at a top surface, said plurality of holes form a structure of leads and a die pad on said electrically conductive layer;
   (b) filling said plurality of holes with a non-conductive material and leaving selected areas of the electrically conductive layer exposed;
   (c) attaching an electrically conductive foil on said top surface of said electrically conductive layer and said non-conductive material, such that said electrically conductive foil is in electrical communication with said electrically conductive layer, and wherein said electrically conductive foil is in direct physical contact with said non-conductive material that fills said plurality of holes and said conductive foil covers the entire top surface of said non-conductive material, in cross-section, that fills said plurality of holes; and
   (d) etching said electrically conductive foil to create a network of leads, die pad, bus lines, dam bars and tie lines, wherein said bus lines connect said leads to said dam bar, said dam bar is connected to said tie line and said tie line is connected to said die pad; wherein said etched electrically conductive foil maintains electrical communication between the leads and die pad after bottom portions of the leads have been isolated in subsequent processing steps.

2. The method according to claim 1 wherein said plurality of holes at a top surface are formed by:
   applying a resist to said top surface of said electrically conductive layer, said resist being developed to expose selected areas of said top surface; and
   etching the exposed areas of said top surface.

3. The method according to claim 1 wherein said plurality of holes at a top surface are formed by:
   providing a conductor material on selected areas of said top surface of said electrically conductive layer.

4. The method according to claim 3 wherein said conductor material is at least one of silver, gold, nickel and copper.

5. The method according to claim 1 further comprising, before step (d):
   applying a resist to said electrically conductive foil, said resist being developed to expose selected areas of said electrically conductive foil to create said network of leads, die pad, bus lines, dam bars and tie lines.

6. The method according to claim 1 further comprising:
   plating said leads and at least the periphery of said die pad with a conductor material.

7. The method according to claim 6 wherein said conductor material is at least one of silver, gold, nickel and copper.

8. The method according to claim 1 further comprising:
   plating areas of the bottom surface of said electrically conductive layer that are opposite to the leads and the die pad with a conductor material.

9. The method according to claim 1 wherein the electrically conductive foil is copper.

10. A method of manufacturing a semiconductor package comprising:
    (a) providing an electrically conductive layer having a plurality of holes at a top surface;
    (b) filling said plurality of holes with a non-conductive material and leaving selected areas of the electrically conductive layer exposed;
    (c) attaching an electrically conductive foil on said top surface of said electrically conductive layer and said non-conductive material, such that said electrically conductive foil is in electrical communication with said electrically conductive layer, and wherein said electrically conductive foil is in direct physical contact with said non-conductive material that fills said plurality of holes and said conductive foil covers the entire top surface of said non-conductive material, in cross-section, that fills said plurality of holes;
    (d) etching said electrically conductive foil to create a network of leads, die pad, bus lines, dam bars and tie lines, wherein said bus lines connect said leads to said dam bar, said dam bar is connected to said tie line and said tie line is connected to said die pad;

(e) attaching a semiconductor die to said die pad; and (f) etching a bottom surface of said electrically conductive layer to isolate bottom portions of said leads from each other, wherein said etched electrically conductive foil maintains electrical communication between the leads and die pad after the bottom portions of the leads have been isolated.

11. The method of claim 10 further comprising:

before step (e), plating said leads and at least the periphery of said die pad with a conductor material;

after step (e), attaching a plurality of bond wires from said die to said leads;

encapsulating said die and said plurality of wires; and/or after step (f), adding solder to the bottom of said leads.

12. The method according to claim 11 wherein said solder at the bottom of said leads are solder balls.

13. The method according to claim 11 wherein said solder at the bottom of said leads is a solder material deposited by solder plating.

14. The method according to claim 11 wherein said conductor material is at least one of silver, gold, nickel and copper.

15. The method according to claim 11 further comprising before step (e) plating areas of the bottom surface of said electrically conductive layer that are opposite to the leads and the die pad with a conductor material.

16. The method according to claim 10 wherein said plurality of holes at a top surface are formed by:

applying a resist to said top surface of said electrically conductive layer, said resist being developed to expose selected areas of said top surface; and etching the exposed areas of said top surface.

17. The method according to claim 10 wherein said plurality of holes at a top surface are formed by:

providing a conductor material on selected areas of said top surface of said electrically conductive layer.

18. The method of according to claim 10 further comprising, before step (d):

applying a resist to said electrically conductive foil, said resist being developed to expose selected areas of said electrically conductive foil to create said network of leads, die pad, bus lines, dam bars and tie lines.

19. The method according to claim 10 wherein said etching step (f) comprises:

etching a plurality of holes in a bottom surface of said copper layer that are opposite to the plurality of holes etched in said top surface of said electrically conductive layer to electrically isolate bottom portions said leads from each other.

\* \* \* \* \*